US012112918B2

(12) United States Patent
Platow et al.

(10) Patent No.: US 12,112,918 B2
(45) Date of Patent: Oct. 8, 2024

(54) DUAL SOURCE INJECTOR WITH SWITCHABLE ANALYZING MAGNET

(71) Applicant: Axcelis Technologies, Inc., Beverly, MA (US)

(72) Inventors: Wilhelm Platow, Newburyport, MA (US); Neil Bassom, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 18/481,111

(22) Filed: Oct. 4, 2023

(65) Prior Publication Data

US 2024/0029998 A1 Jan. 25, 2024

Related U.S. Application Data

(63) Continuation of application No. 17/705,503, filed on Mar. 28, 2022, now Pat. No. 11,823,858.

(51) Int. Cl.
*H01J 37/317* (2006.01)
*G21K 5/04* (2006.01)
(Continued)

(52) U.S. Cl.
CPC ............ *H01J 37/3171* (2013.01); *G21K 5/04* (2013.01); *H01J 37/1475* (2013.01); *H01L 21/0415* (2013.01)

(58) Field of Classification Search
CPC ........... A61N 5/1077; A61N 2005/1087; H01J 37/1475; H01J 37/3171; H01J 2237/022;
(Continued)

(56) References Cited

U.S. PATENT DOCUMENTS 3,571,642 A 3/1971 Westcott
5,315,118 A 5/1994 Mous
(Continued)

FOREIGN PATENT DOCUMENTS

EP 0986071 A2 3/2000
JP S6044953 U 3/1985
JP S6261258 A * 9/1985

OTHER PUBLICATIONS

Burducea et al.; "Tandem accelerators in Romania: Multi-tools for science, education and technology"; American Institute of Physics AIP Conference Proceedings 1852, 060001 (2017); doi: 10.1063/1.4984865 Published in 2017.
(Continued)

*Primary Examiner* — David E Smith
*Assistant Examiner* — Hsien C Tsai
(74) *Attorney, Agent, or Firm* — Eschweiler & Potashnik, LLC

(57) ABSTRACT

An ion implantation system has a mass analyzing magnet having interior and exterior region and defining a first entrance, second entrance, and an exit. A first ion source defines a first ion beam directed toward the first entrance along a first beam path. A second ion source defines a second ion beam directed toward the second entrance along a second beam path. A magnet current source supplies a magnet current to the mass analyzing magnet. Magnet control circuitry controls a polarity of the magnet current based on a formation of the first or second ion beam. The mass analyzing magnet mass analyzes the respective first or second ion beam to define defining a mass analyzed ion beam along a mass analyzed beam path. At least one shield in the interior or exterior region prevents line-of-sight between the first and second ion sources. Beamline components modify the mass analyzed ion beam.

20 Claims, 5 Drawing Sheets

SOURCE CURRENT 2
120
100
122
118
116
128
SOURCE MATERIAL 2
134
192
136
146
138
204
152
154
148
206
130
151
142
144
MAGNET CURRENT
MAGNET CONTROLLER
106
150
202
132
SOURCE MATERIAL 1
104
114
102
108
112
SOURCE CURRENT 1
110

(51) Int. Cl.
*H01J 37/147* (2006.01)
*H01L 21/04* (2006.01)

(58) Field of Classification Search
CPC ....... H01J 2237/0264; H01J 2237/1523; H01J 2237/31701
See application file for complete search history.

(56) References Cited

U.S. PATENT DOCUMENTS

| | | | | |
|---|---|---|---|---|
| 6,809,325 | B2 | 10/2004 | Dahl | |
| 2021/0290983 | A1 * | 9/2021 | Touchi | G01R 33/36 |

OTHER PUBLICATIONS

Notice of Allowance dated Jul. 11, 2023 for U.S. Appl. No. 17/705,503.
International Search Report dated Jun. 6, 2023 for International Application No. PCT/US2023/016076.

* cited by examiner

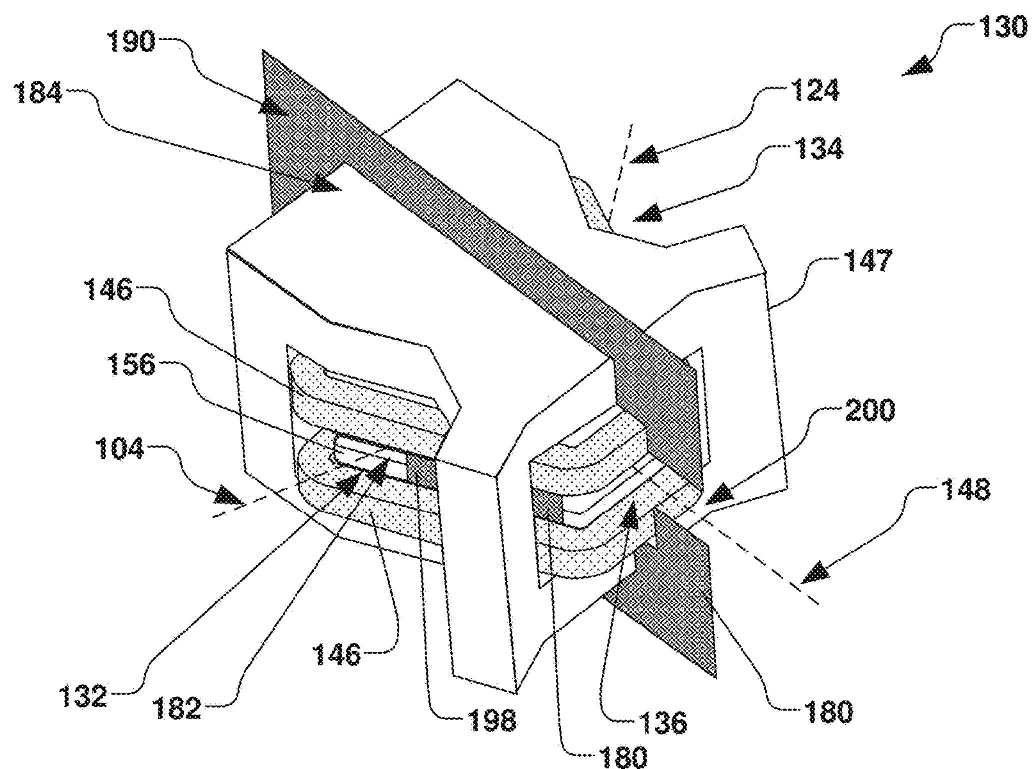
Fig. 2
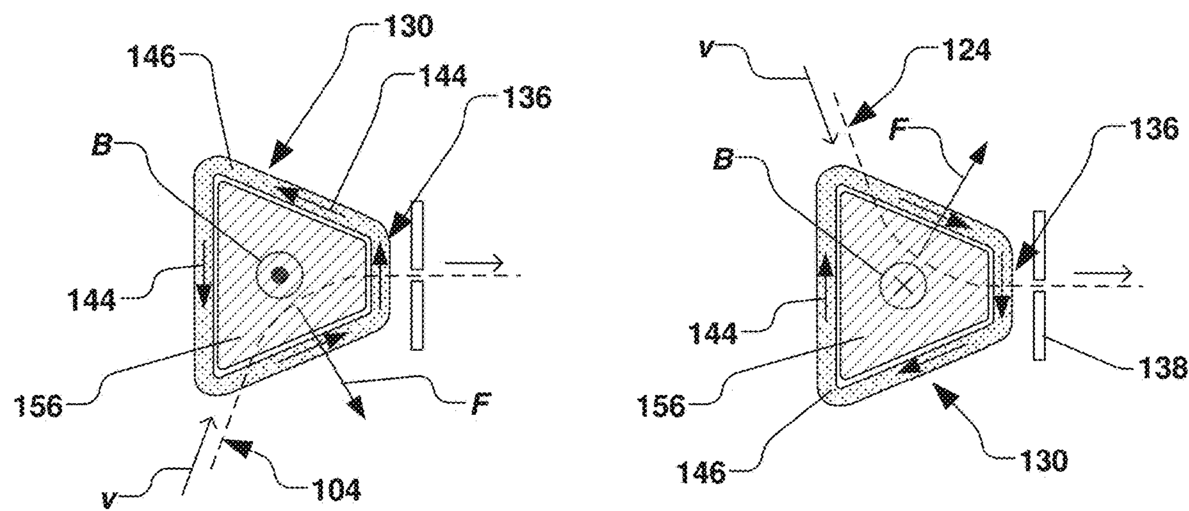
Fig. 3A
Fig. 3B

DUAL SOURCE INJECTOR WITH SWITCHABLE ANALYZING MAGNET

REFERENCE TO RELATED APPLICATIONS

This application is a Continuation of U.S. patent application Ser. No. 17/705,503 filed on Mar. 28, 2022, entitled "DUAL SOURCE INJECTOR WITH SWITCHABLE ANALYZING MAGNET", the contents of which are herein incorporated by reference in their entirety.

FIELD

The present invention relates generally to ion implantation systems and methods, and more specifically to a mass analyzing magnet configured for multiple ion sources.

BACKGROUND

Ion implanters are conventionally utilized to place a specified quantity of dopants or impurities within workpieces or semiconductor wafers. In a typical ion implantation system, a dopant material is ionized, therein generating a beam of ions, generally referred to as an ion beam. The ion beam is directed at a surface of the workpiece to implant ions into the workpiece, wherein the ions penetrate the surface of the workpiece and form regions of desired conductivity therein. For example, ion implantation has particular use in the fabrication of transistors in semiconductor workpieces. A typical ion implanter comprises an injector, a beamline assembly having a mass analysis apparatus for directing and/or filtering (e.g., mass resolving) ions within the ion beam, and a process chamber containing one or more workpieces to be treated.

An ion source associated with the injector typically produces ions, whereby the ions are extracted from the ion source to form the ion beam. A desired ion species is selected to be implanted via an analyzing magnet, whereby the beamline further modifies the ion beam, including acceleration, deceleration, scanning, and/or angle control of the ion beam to define a final ion beam. The process chamber typically receives the final ion beam for implantation into the workpiece.

Conventional injectors often suffer from so-called "ion source life" issues associated with erosion of cathodes and material deposition within the ion source, as well as flaking and electrical glitching related thereto. Such ion source life issues lead to shortened lifetimes of the ion source, thus demanding maintenance and/or replacement of the ion source, whereby productivity of the ion implanter is deleteriously affected.

Some ion implanters implement multiple ion sources for changing from a first ion species to a second ion species, or for changing ion sources when maintenance of the respective ion source is called for. Such conventional ion sources, however, typically require a shutdown of all ion sources of the ion implanter for removal or maintenance of the ion source, as harmful x-ray radiation is emitted during operation of the ion sources. As such, productivity of the implanter is decreased for maintenance of the ion source or for change-over of source species.

SUMMARY

The present disclosure provides an ion implantation system having a plurality of ion sources, whereby each ion source can be safely and readily accessed while maintaining operation of the ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, an ion implantation system is provided, wherein the ion implantation system comprises a mass analyzing magnet comprising a yoke and a coil defining a first entrance, a second entrance, and an exit of the mass analyzing magnet. One or more of the yoke and the coil, for example, define an interior region and an exterior region of the mass analyzing magnet.

In accordance with one example aspect, a first ion source is configured to define a first ion beam directed toward the first entrance of the mass analyzing magnet along a first beam path. A second ion source is further configured to define a second ion beam directed toward the second entrance the mass analyzing magnet along a second beam path. A magnet current source is further configured to supply a magnet current to the mass analyzing magnet.

In one example, magnet control circuitry is coupled to the mass analyzing magnet and magnet current source, wherein the magnet control circuitry is configured to selectively control a polarity of the magnet current supplied to the mass analyzing magnet based on a selective formation each of the first ion beam and the second ion beam. The mass analyzing magnet, for example, is configured to mass analyze the first ion beam and second ion beam, respectively, thereby defining a mass analyzed ion beam at the exit of the mass analyzing magnet along a mass analyzed beam path. A plurality of beamline components, for example, are further arranged downstream of the mass analyzing magnet and configured to direct the mass analyzed ion beam towards a workpiece. The plurality of beamline components, for example, can comprise one or more of an accelerator, a decelerator, an energy filter, a focusing lens, a steering lens, a measurement system, a scanner, and a corrector.

In accordance with another example aspect, one or more shields are positioned in one or more of the interior region and exterior region of the mass analyzing magnet. The one or more shields, for example, are configured to prevent a line-of-sight between the first ion source and the second ion source. The one or more shields can be configured to generally prevent a transmission of x-rays between the first ion source and the second ion source. For example, at least one of the one or more shields is comprised of lead.

For example, the one or more shields can comprise a central shield positioned between the first entrance and the second entrance of the mass analyzing magnet within the interior region of the mass analyzing magnet. The mass analyzed beam path, for example, defines an exit axis, and wherein the central shield is positioned along the exit axis.

In another example, the one or more shields comprise one or more exterior magnet shields positioned in the exterior region of the mass analyzing magnet, whereby the one or more exterior magnet shields extend generally perpendicular to the exit axis. The one or more exterior shields, for example, can be positioned run parallel to the exit axis. The one or more exterior shields, for example, comprise an exit aperture defined along the mass analyzed beam path.

Regarding another example, the first beam path defines a first entrance axis, and the second beam path defines a second entrance axis. As such, the one or more shields can further comprise a first entrance shield and a second entrance shield respectively positioned along the first entrance axis and the second entrance axis. The first entrance shield and the second entrance shield, for example, can be positioned within the interior region of the mass analyzing magnet.

In another example, the mass analyzing magnet comprises a dipole magnet, such as a uniform field magnet having substantially flat poles defined therein. The dipole magnet, for example, is configured to deflect the first ion beam and the second ion beam, respectively, by a deflection angle ranging between approximately 70° and approximately 110° when viewed along the first beam path and the second beam path, respectively.

In accordance with another aspect of the disclosure, a method for maintaining an ion implantation system is provided. According to one example, the method comprises applying a polarity of a magnet current to a mass analyzing magnet, whereby one or more shields are provided within the mass analyzing magnet. A first source current is applied to a first ion source, thereby forming and directing a first ion beam toward a first entrance of a mass analyzing magnet along a first beam path. The first ion beam is further mass analyzed, whereby the first ion beam is deflected between approximately 70° and approximately 110°. The first source current applied to the first ion source is further halted, thereby extinguishing the first ion beam.

The polarity of the magnet current applied to the mass analyzing magnet, for example, is reversed, and a second source current is applied to a second ion source. As such, a second ion beam is formed and directed toward a second entrance of the mass analyzing magnet along a second beam path, whereby the second ion beam is mass analyzed deflected between approximately 70° and approximately 110°.

Accordingly, maintenance can be performed on the first ion source concurrent to forming the second ion beam, whereby a line-of-sight between the first ion source and second ion source is prevented by the one or more shields positioned within the mass analyzing magnet, whereby x-ray transmission from the second ion source is generally blocked from reaching the first ion source.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 is a perspective schematic diagram of an example mass analyzing magnet in accordance with various aspects of the present invention.

FIG. 3A is a schematic view of an example mass analyzing magnet having a first polarity applied to a coil in accordance with various aspects of the present invention.

FIG. 3B is a schematic view of the example mass analyzing magnet of FIG. 3A having a second polarity applied to the coil in accordance with various aspects of the present invention.

DETAILED DESCRIPTION

Figure 1A:
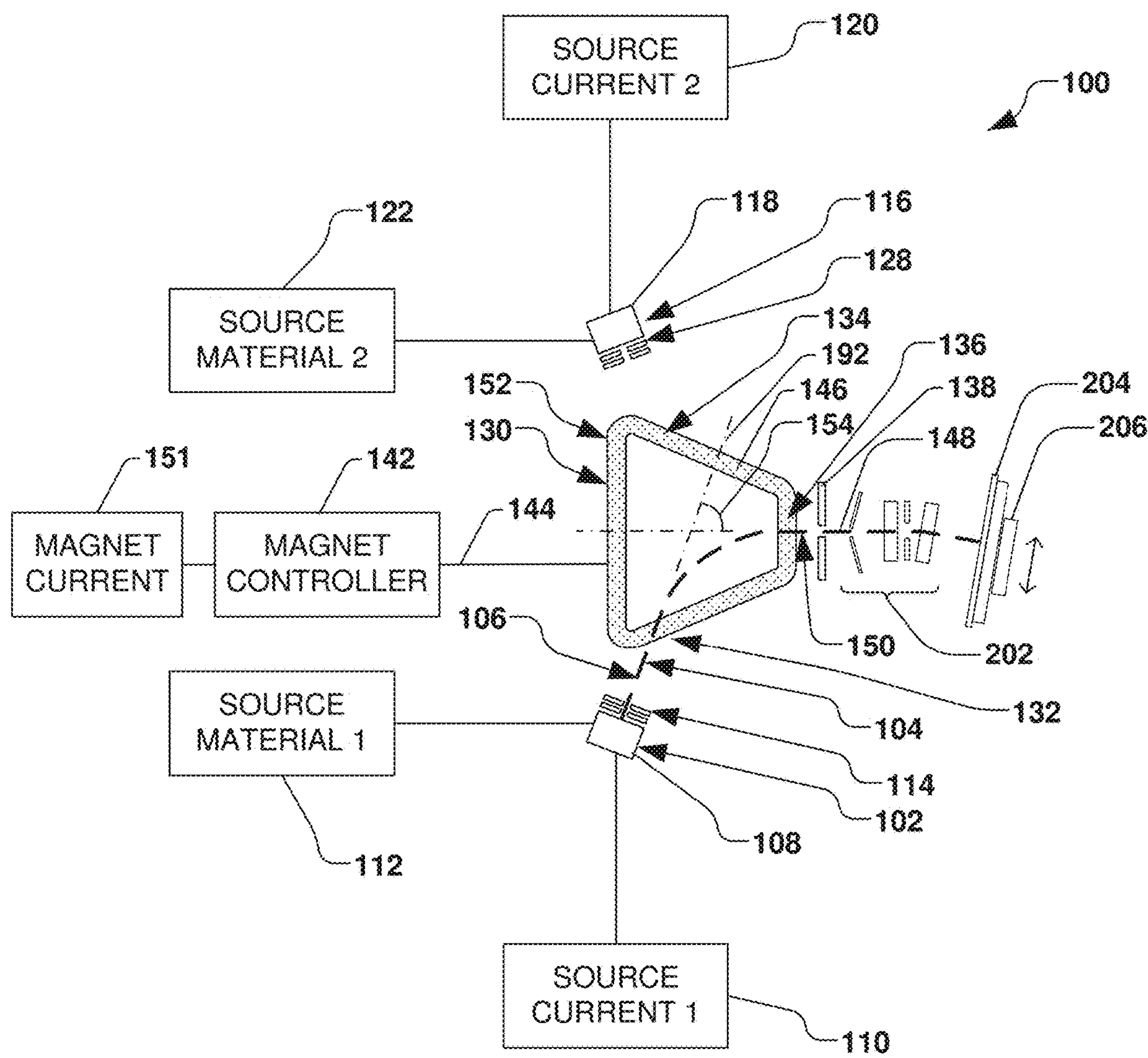
FIGS. 1A-1B are schematic diagrams illustrating an example ion implantation system having multiple ion sources and a single beamline in accordance with various aspects of the present invention.

The present disclosure is directed generally toward an ion implantation system and method for implanting ions in a workpiece, wherein a mass analyzing magnet is configured to accept ions generated from a plurality of ion sources. A shielding apparatus is provided such that each of the plurality of ion sources, for example, can be safely and individually accessed and maintained during operation of any other of the plurality of ion sources in the system. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

In accordance with various aspects of the disclosure, an ion implantation system is provided having an injector comprising a plurality of ion sources, thereby increasing productivity of the ion implantation system. A pair of ion sources, for example, can be respectively configured to produce ions from differing source materials, thereby avoiding memory effects when changing between implants using the differing source feed materials. Additionally, the present disclosure advantageously allows for maintenance of a first of the pair of ion sources while a second of the pair ion sources produces ions for implantation, thus minimizing downtime when compared to conventional systems.

Since the ion implantation system of the present utilizes multiple ion sources that can be individually maintained concurrent with operation of the ion implantation system, the present disclosure is particularly advantageous for applications using radio frequency (RF) ion sources. RF ion sources can provide significantly longer lifetimes than conventional arc-discharge ion sources, but due to the aforementioned memory effects and radiation concerns, RF ion sources have not been widely implemented for ion implantation due to the time and complexities of exchanging or cleaning the RF ion sources in conventional systems.

In general, the plurality of ion sources of the present disclosure, for example, can individually inject an ion beam into separate entrances of an analyzing magnet having dual polarity, whereby a mass analyzed ion beam is produced at an exit of the analyzing magnet. As such, common beamline components transport the mass analyzed ion beam downstream of the analyzing magnet to a common process chamber, thus significantly reducing costs and complexities associated with conventional implanters employing two beamlines and a common process chamber.

Figure 1B:
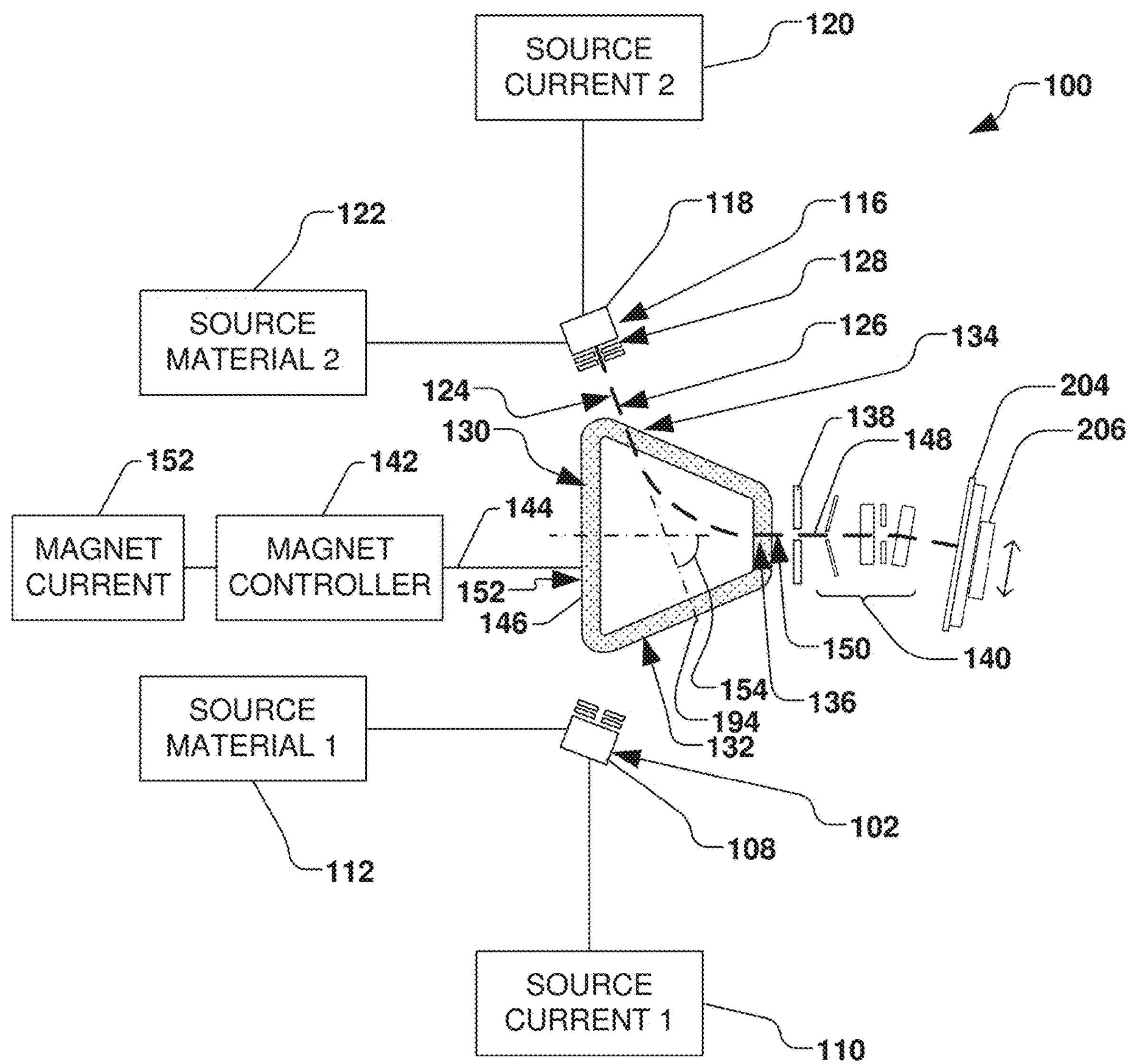

Referring now to the Figures, FIGS. 1A-1B illustrates an ion implantation system 100 (also called an ion implanter) in accordance with various aspects of the present disclosure. The ion implantation system 100, for example, comprises a first ion source 102 configured to produce a first ion beam 104 along a first beam path 106, as illustrated in FIG. 1A. The first ion source 102, for example, comprises a first arc chamber 108, whereby a first source arc current 110 ionizes a first source material 112, and whereby the first ion beam 104 is extracted from the first ion source via a first extraction apparatus 114 (e.g., one or more electrodes biased with respect to the first arc chamber 108).

A second ion source 116, for example, is further provided, wherein the second ion source comprises a second arc chamber 118, whereby a second source arc current 120 ionizes a second source material 122, and whereby the second ion source is configured to produce a second ion beam 124 along a second beam path 126, as illustrated in FIG. 1B. The second ion beam 124, for example, is extracted from the second ion source via a second extraction apparatus 128 (e.g., one or more electrodes biased with respect to the second arc chamber 118).

The ion implantation system 100, for example, further comprises a mass analyzing magnet 130 configured to accept the first ion beam 104 of FIG. 1A and the second ion beam 124 of FIG. 1B. For example, the mass analyzing magnet 130 is illustrated in FIG. 2, includes a field generating component configured to establish a dipole magnetic field within the mass analyzing magnet, as will be discussed in further detail, infra. For example, the mass analyzing magnet 130 comprises a first entrance 132 and a second entrance 134 defined therein, whereby the first entrance is configured to accept the first ion beam 104 from the first ion source 102 of FIG. 1A, and the second entrance is configured to accept the second ion beam 124 from the second ion source 116 of FIG. 1B. Only ions having the correct charge-to-mass ratio are able to pass through an exit 136 of the mass analyzing magnet 130 and be resolved by a mass resolving aperture 138 in order to continue downstream to various of the plurality of beamline components 140. Ions not having the correct charge-to-mass ratio collide with the walls of the mass analyzing magnet 130 and/or the mass resolving aperture 138 and are not passed through the mass resolving aperture.

Magnet control circuitry 142, for example, is further provided and configured to supply a magnet current 144 to a coil 146 of the mass analyzing magnet 130. The magnet current 144 applied to the coil 146, whereby in conjunction with a yoke 147 (e.g., steel laminations) shown in FIG. 2, for example, a magnetic field B is provided based on the intensity and polarity of the magnet current, as seen in FIGS. 3A-3B.

As illustrated in FIG. 3A, for example, the direction of the magnetic field B is given by Maxwell's corkscrew rule. If the magnet current 144 runs counter-clockwise (illustrated by counter-clockwise arrows), as illustrated in FIG. 3A, the magnetic field B will point out of the page plane. The deflection of the first ion beam 104 (e.g., a positive ion beam) is thus given by Fleming's left-hand rule. Positive ions of the first ion beam 104 with velocity v will thus experience a perpendicular force F and be deflected as illustrated in FIG. 3A.

FIG. 3B illustrates an example for the second ion beam 124 (e.g., a positive ion beam), whereby the magnet current 144 runs clockwise (illustrated by clockwise arrows). Accordingly, the mass analyzing magnet 130 is configured to individually resolve each of the first ion beam 104 from the first ion source 102 illustrated in FIG. 1A and the second ion beam 124 from the second ion source 116 by simply switching polarity of the magnet current 144 in order to define a mass analyzed ion beam 148 at the exit 136 of the mass analyzing magnet 130 along a mass analyzed beam path 150.

The magnet control circuitry 142 (e.g., a controller or other switching apparatus), for example, is operably coupled to the mass analyzing magnet 130 and a magnet current source 151, whereby the magnet control circuitry is configured to selectively control the polarity of the magnet current 144 supplied to the mass analyzing magnet based on a selective formation each of the first ion beam 104 and the second ion beam 124, wherein the mass analyzing magnet is configured to respectively and individually mass analyze the first ion beam and second ion beam. For example, only one of the first ion source 102 and the second ion source 116 is operated at a time, whereby the polarity of the magnet current 144 is selectively controlled, as illustrated in FIGS. 3A and 3B, based on the desired operation of the first ion source or the second ion source.

The mass analyzing magnet 130 shown in FIGS. 1A-1B, for example, comprises a dipole magnet 152 (e.g., a uniform field magnet having substantially flat poles) having a predetermined deflection angle 154 associated therewith. In other words, the dipole magnet 152, for example, is configured to deflect the first ion beam 104 and the second ion beam 124, respectively, by the predetermined deflection angle 154 from the first beam path 106 and the second beam path 126, respectively. The predetermined deflection angle 154, for example, is between approximately 70° and approximately 110°. In another example, the predetermined deflection angle 154 is less than 90°. In the example shown in FIGS. 1A-1B, the predetermined deflection angle 154 is 70°, with approximately 45° entrance pole rotation.

Figure 4:
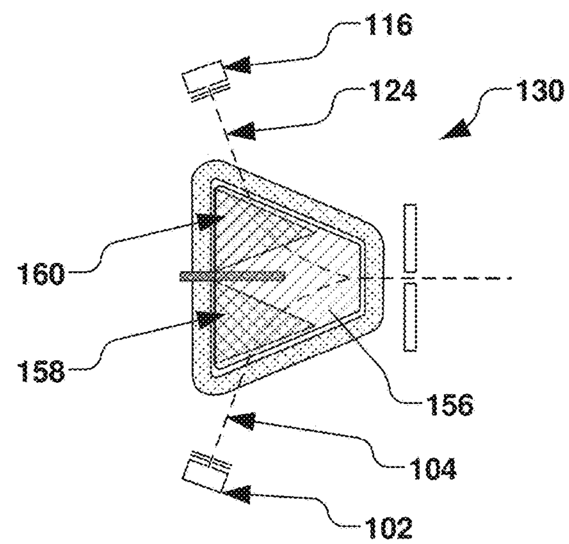
FIG. 4 is a partial cross-sectional plan view of an example mass analyzing magnet in accordance with various aspects of the present invention.

The present disclosure further contemplates various architectures of the mass analyzing magnet 130, such as shown in FIGS. 2-6. The mass analyzing magnet 130 shown in FIG. 4, for example, comprises poles 156 (only one of two poles is shown in FIG. 4), whereby the poles are configured to be indexed in areas 158, 160 where the first ion beam 104 and second ion beam 124 are approximately two gap distances (e.g., illustrated as hatched areas) from one another. The poles 156 of the dipole magnet 152, for example, can be planar, or the poles can be indexed or curved (not shown) based on desired characteristics of the dipole magnet. Further, the present disclosure contemplates the mass analyzing magnet 130 being asymmetric, whereby the first ion source 102 and the second ion source 116 have differing deflection angles 154 and/or pole face rotations.

The present disclosure appreciates that the first ion source 102 and second ion source 116 produce X-ray radiation when forming the first ion beam 104 and second ion beam 124. Such X-ray radiation can be dangerous to an operator when performing maintenance on one of the first and second ion sources 102, 116 while the other is operating. Accordingly, referring again to FIGS. 5 and 6, the present disclosure further provides one or more shields 180 positioned in one or more of an interior region 182 and an exterior region 184 of the mass analyzing magnet 130, whereby the one or more shields are configured to prevent a line-of-sight between the first ion source 102 and the second ion source 116.

The one or more shields 180, for example, generally permit an operator to perform maintenance on the first ion source 102 while the second ion source 116 is running (e.g., producing ions), or vice versa. For example, the one or more shields 180 allow for such removal/replacement of a source while the other source is warming up or operating, etc. The present disclosure further contemplates provision of one or more radiation detectors 185 (e.g., one or more X-ray detectors) to indicate safe radiation levels during maintenance. The one or more radiation detectors 185, for example, can be coupled to an interlock system (not shown) to permit access to the first ion source 102 and/or second ion source 116 only when radiation levels fall below an acceptably safe level.

The present disclosure further allows for switching between beam species via the first ion source 102 and second ion source 116, while also permitting safe maintenance of one of the ion sources while the other ion source is operated to form the ion beam. As such, it can be appreciated that an "infinite source life" or "zero down time" can be attained, whereby the ion implantation system 100 of FIGS. 1A-1B can be continuously operated utilizing one of the first ion source 102 and the second ion source 116.

Figure 5:
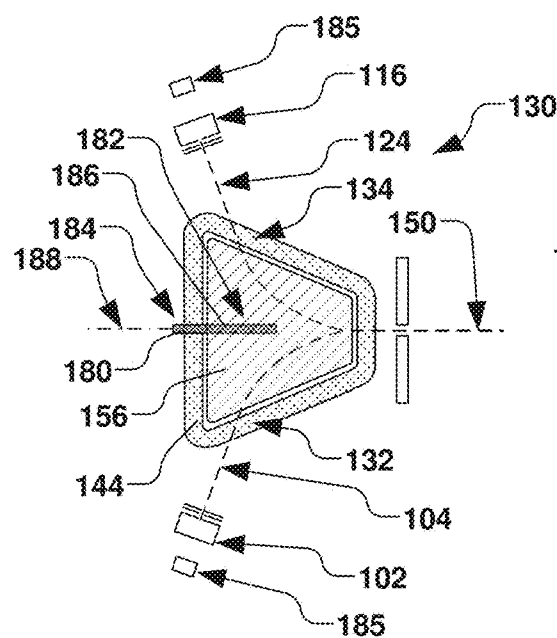
FIG. 5 is a partial cross-sectional plan view of an example mass analyzing magnet having a shield in accordance with various aspects of the present invention.

Referring again to FIG. 2, the interior region 182 and exterior region 184, for example, are generally defined by one or more of the yoke 147, the coil 146, and the poles 156 of the mass analyzing magnet 130. In accordance with one example, the one or more shields 180 comprise a central shield 186 positioned between the first entrance 132 and the second entrance 134 of the mass analyzing magnet 130 within the interior region 182 of the mass analyzing magnet, as illustrated in FIG. 5. For example, the mass analyzed beam path 150 defines an exit axis 188, and wherein the central shield 186 is positioned along the exit axis. The one or more shields 180, for example, can further comprise one or more external magnet shields 190 positioned in the exterior region 184 of the mass analyzing magnet 130, wherein the one or more external magnet shields generally extend from the mass analyzing magnet, such as parallel to the exit axis 188. FIG. 2, for example, illustrates the one or more external magnet shields 190 positioned in the exterior region 184 of the mass analyzing magnet 130.

Figure 6:
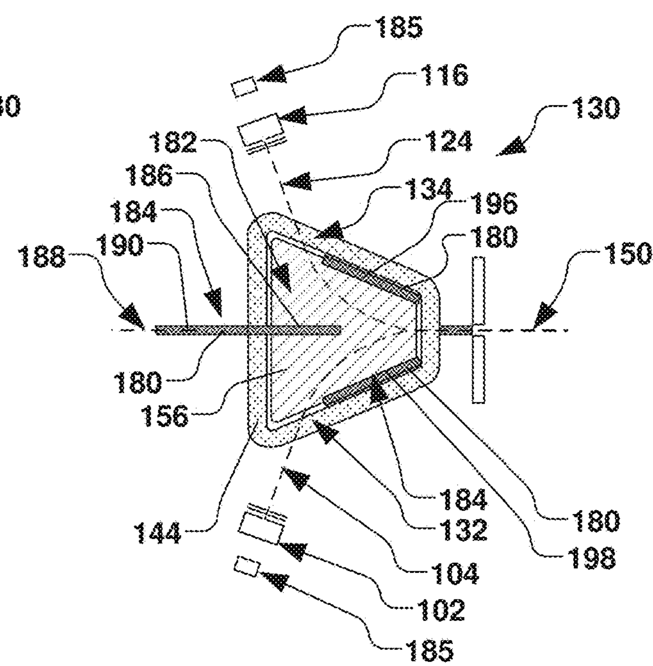
FIG. 6 is a partial cross-sectional plan view of an example mass analyzing magnet having a plurality of shields in accordance with various aspects of the present invention.

In another example, the first beam path 106 defines a first entrance axis 192, as illustrated in FIG. 1A, and the second beam path defines a second entrance axis 194, as illustrated in FIG. 1B. The one or more shields 180, for example, can thus further comprise a first entrance shield 196 and a second entrance shield 198 respectively positioned along the first entrance axis 192 and the second entrance axis 194, as illustrated in FIGS. 5 and 6. In the present example, the first entrance shield 196 and the second entrance shield 198 are shown as being positioned within the interior region 182 of the mass analyzing magnet 130, however the first and second entrance shields may be alternatively provided within the exterior region 184.

In another example, the one or more external magnet shields 190 can comprise an exit aperture 200 illustrated in FIG. 2, wherein the exit aperture is defined along the mass analyzed beam path 150 to allow the mass analyzed ion beam 148 to exit the mass analyzer magnet unimpeded.

Any of the one or more 180 shields, for example, comprises lead (Pb) to prevent transmission of x-ray radiation therethrough. For example, while not shown, the one or more shields 180 can comprise a lead sheet that is lined with graphite to ameliorate sputtering of the lead into the beamline, while providing adequate x-ray shielding. The lead, for example, can be sandwiched with aluminum or other metal for additional rigidity and handling properties. Alternatively, the one or more shields can comprise or be comprised of a non-magnetic steel or any high-Z material, such as tungsten, in order to achieve shielding from the x-ray radiation.

The present disclosure appreciates that numerous other shapes and configurations of the mass analyzing magnet 130 and the one or more shields 180 are possible, such as varying arrangements of the poles, yoke, coil, etc., whereby the one or more shields can be tailored to fit the analyzing magnet and configuration and placement of the first and second ion sources 102, 116. It shall be appreciated that all such configurations are considered to fall within the scope of the present disclosure.

In accordance with a further aspect of the disclosure, as illustrated again in FIGS. 1A-1B, a plurality of beamline components 140 are further arranged downstream of the mass analyzing magnet 130, whereby the plurality of beamline components are configured to direct the mass analyzed ion beam 148 towards a workpiece 204 positioned on a workpiece holder 206. The plurality of beamline components, for example, comprise one or more of an accelerator, a decelerator, an energy filter, an aperture, a focusing lens, a steering lens, a measurement apparatus, an angular energy filter, a measurement system, a scanner, and a corrector.

In accordance with yet another exemplary aspect of the disclosure, the magnet control circuitry 142 can comprise any controller that is operably coupled to the ion implantation system 100 for control of the system. For example, the controller is operably coupled to, and configured to control, one or more of the first ion source 102, second ion source 116, first source arc current 110, second source arc current 120, and any of the plurality of beamline components 140 such as any extraction assembly, aperture, focus and/or steering element, scanner apparatus, combined lens system, energy resolving system, beam and workpiece neutralization system, measurement system, and workpiece holder and translation system.

Figure 7:
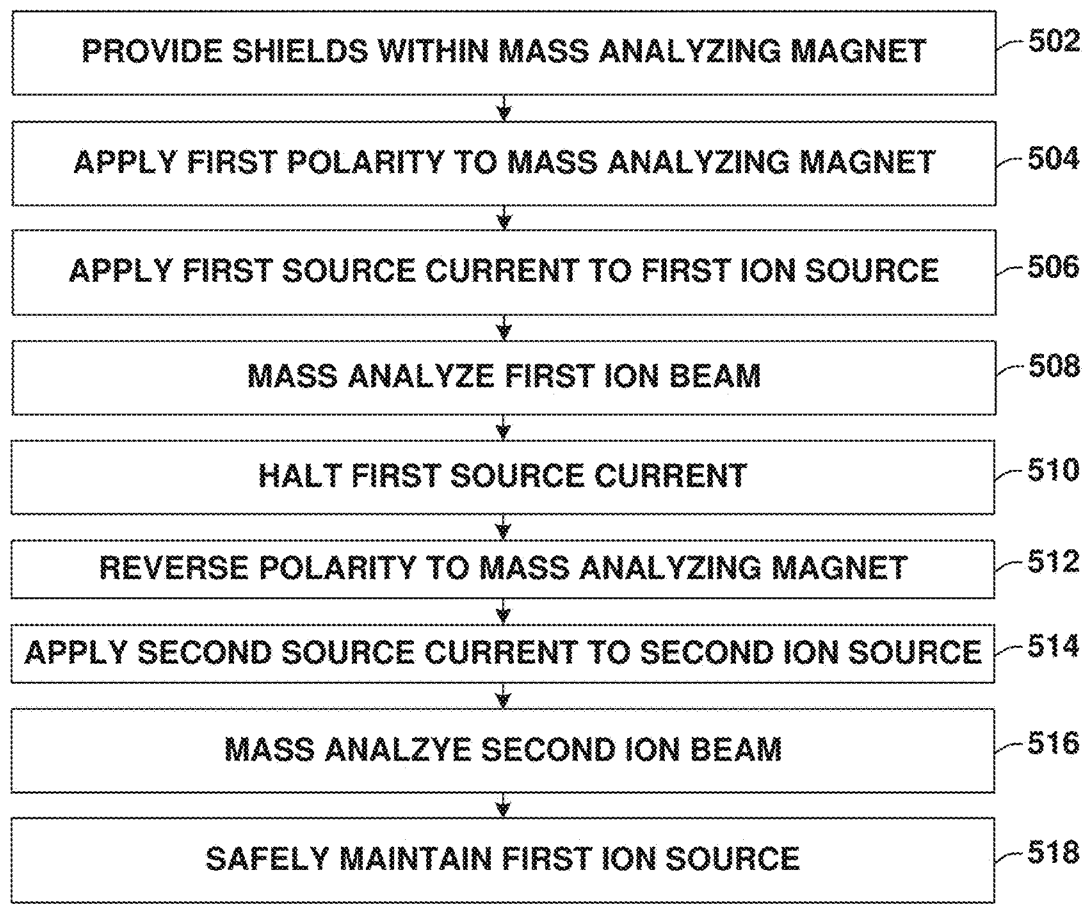
FIG. 7 illustrates an example method for implanting ions into a workpiece in accordance with various further aspects of the present invention.

In accordance with another example aspect of the present invention, FIG. 7 illustrates a method 500 for maintaining an ion implantation system. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 500, for example, comprises providing one or more shields within a mass analyzing magnet in act 502, and applying a polarity of a magnet current to the mass analyzing magnet in act 504. A first source current, for example, is applied to a first ion source in act 506, thereby forming and directing a first ion beam toward a first entrance of a mass analyzing magnet along a first beam path. The first ion beam is mass analyzed in act 508, whereby the first ion beam is deflected between approximately 70° and approximately 110°.

In act 510, the first source current applied to the first ion source is halted, thereby extinguishing the first ion beam. In act 512, the polarity of the magnet current applied to the mass analyzing magnet is reversed, and in act 514, a second source current is applied to a second ion source, thereby forming and directing a second ion beam toward a second entrance of the mass analyzing magnet along a second beam path. The second ion beam is further mass analyzed in act 516, whereby the second beam path is also deflected between approximately 70° and approximately 110°.

In act 518, for example, maintenance is safely performed on the first ion source concurrent to forming the second ion beam, whereby a line-of-sight between the first ion source and second ion source is prevented by the one or more shields positioned within the mass analyzing magnet, thereby blocking x-rays from the second ion source.

It is to be further appreciated that the above methodology can be similarly practiced for safely maintaining the second ion source in a similar manner. The systems and methods of the present disclosure thus provide for safely maintaining each of the first and second ion sources while the other of the first and second ion sources is operated for forming the ion beam and/or implantation of ions into the workpiece.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system comprising:
- a mass analyzing magnet comprising a yoke and a coil defining a first entrance, a second entrance, and an exit of the mass analyzing magnet;
- a first ion source configured to define a first ion beam directed toward the first entrance of the mass analyzing magnet along a first beam path;
- a second ion source configured to define a second ion beam directed toward the second entrance of the mass analyzing magnet along a second beam path; and
- a magnet current source configured to supply a magnet current to the mass analyzing magnet; and
- magnet control circuitry coupled to the mass analyzing magnet and magnet current source, wherein the magnet control circuitry is configured to selectively control a polarity of the magnet current supplied to the mass analyzing magnet based on a selective formation of each of the first ion beam and the second ion beam, wherein the mass analyzing magnet is configured to mass analyze the first ion beam and second ion beam, respectively, thereby defining a mass analyzed ion beam at the exit of the mass analyzing magnet along a mass analyzed beam path.

2. The ion implantation system of claim 1, further comprising a central shield positioned within an interior region of the mass analyzing magnet along the mass analyzed beam path, wherein the central shield is configured to prevent a line-of-sight between the first ion source and the second ion source.

3. The ion implantation system of claim 1, further comprising one or more external magnet shields positioned in an exterior region of the mass analyzing magnet and extending generally perpendicular to the mass analyzed beam path, wherein the one or more external magnet shields are configured to prevent a line-of-sight between the first ion source and the second ion source.

4. The ion implantation system of claim 1, further comprising a first entrance shield and a second entrance shield respectively positioned along the first beam path and the second beam path, wherein the first entrance shield and the second entrance shield are configured to prevent a line-of-sight between the first ion source and the second ion source.

5. The ion implantation system of claim 4, wherein the first entrance shield and the second entrance shield are positioned within an interior region of the mass analyzing magnet.

6. The ion implantation system of claim 1, further comprising:
- a first entrance shield positioned along the first beam path; and
- a second entrance shield positioned along the second beam path, wherein the first entrance shield and the second entrance shield are configured to prevent a line-of-sight between the first ion source and the second ion source.

7. The ion implantation system of claim 1, wherein the mass analyzing magnet comprises a dipole magnet having two poles that are substantially flat, indexed, or curved.

8. The ion implantation system of claim 1, further comprising a plurality of beamline components arranged downstream of the mass analyzing magnet and configured to direct the mass analyzed ion beam towards a workpiece.

9. An ion implantation system comprising:
- a mass analyzing magnet comprising a yoke and a coil defining a first entrance, a second entrance, and an exit of the mass analyzing magnet, and wherein one or more of the yoke and the coil define an interior region and an exterior region of the mass analyzing magnet;
- a first ion source configured to define a first ion beam directed toward the first entrance of the mass analyzing magnet along a first beam path;
- a second ion source configured to define a second ion beam directed toward the second entrance of the mass analyzing magnet along a second beam path; and
- a magnet current source configured to supply a magnet current to the mass analyzing magnet, wherein the mass analyzing magnet is configured to mass analyze the first ion beam and second ion beam, respectively, thereby defining a mass analyzed ion beam at the exit of the mass analyzing magnet along a mass analyzed beam path; and
- one or more shields positioned in one or more of the interior region and exterior region of the mass analyzing magnet and configured to prevent a line-of-sight between the first ion source and the second ion source.

10. The ion implantation system of claim 9, wherein the one or more shields comprise a central shield positioned between the first entrance and the second entrance of the mass analyzing magnet within the interior region of the mass analyzing magnet.

11. The ion implantation system of claim 9, wherein the one or more shields comprise one or more external magnet shields positioned in the exterior region of the mass analyzing magnet and extending generally perpendicular to the mass analyzed beam path.

12. The ion implantation system of claim 9, wherein the one or more shields comprise a first entrance shield and a second entrance shield respectively positioned along the first beam path and the second beam path.

13. The ion implantation system of claim 12, wherein the first entrance shield and the second entrance shield are positioned within the interior region of the mass analyzing magnet.

14. The ion implantation system of claim 9, wherein the one or more shields comprise one or more external magnet shields positioned in the exterior region of the mass analyzing magnet, and wherein the one or more external magnet shields comprise an exit aperture defined along the mass analyzed beam path.

15. The ion implantation system of claim 9, wherein the one or more shields are configured to generally prevent a transmission of x-ray radiation between the first ion source and the second ion source.

16. The ion implantation system of claim 9, wherein the mass analyzing magnet comprises a dipole magnet having two poles that are substantially flat, indexed, or curved.

17. An ion implantation system comprising:

a mass analyzing magnet having a first entrance, a second entrance, and an exit defined therein;

a first ion source configured to define a first ion beam directed toward the first entrance of the mass analyzing magnet along a first beam path;

a second ion source configured to define a second ion beam directed toward the second entrance of the mass analyzing magnet along a second beam path; and a magnet current source configured to supply a magnet current to the mass analyzing magnet, wherein the mass analyzing magnet is configured to mass analyze the first ion beam and second ion beam, respectively, thereby defining a mass analyzed ion beam at the exit of the mass analyzing magnet along a mass analyzed beam path; and one or more shields configured to prevent a line-of-sight between the first ion source and the second ion source.

18. The ion implantation system of claim 17, wherein the one or more shields comprise a central shield positioned between the first entrance and the second entrance of the mass analyzing magnet within an interior region of the mass analyzing magnet.

19. The ion implantation system of claim 17, wherein the one or more shields comprise a first entrance shield and a second entrance shield respectively positioned along the first beam path and the second beam path.

20. The ion implantation system of claim 17, wherein the one or more shields comprise one or more external magnet shields positioned in an exterior region of the mass analyzing magnet, and wherein the one or more external magnet shields comprise an exit aperture defined along the mass analyzed beam path.

* * * * *